United States Patent [19]

Baars et al.

[11] Patent Number: 4,584,715
[45] Date of Patent: Apr. 22, 1986

[54] IMAGE REJECTION MIXER CIRCUIT ARRANGEMENT

[75] Inventors: Nicolaas J. Baars, Bieville, France; Jonathan R. Quartly, Weybridge, England

[73] Assignee: U.S. Philips Corporation, New York, N.Y.

[21] Appl. No.: 658,956

[22] Filed: Oct. 9, 1984

[30] Foreign Application Priority Data

Oct. 14, 1983 [GB] United Kingdom ................ 8327650

[51] Int. Cl.⁴ .......................... H04B 1/10; H04B 1/26
[52] U.S. Cl. ................................... 455/302; 455/317; 455/325; 455/326; 333/154; 333/193
[58] Field of Search ............... 455/302, 317, 323, 325, 455/326, 332; 333/132–134, 151, 154, 193, 194; 310/313 B

[56] References Cited

U.S. PATENT DOCUMENTS

| | | | |
|---|---|---|---|
| 3,159,790 | 12/1964 | Pratt | 455/326 |
| 3,681,697 | 8/1972 | Moroney | 455/302 |
| 4,267,533 | 5/1981 | Dempsey et al. | 333/194 |

FOREIGN PATENT DOCUMENTS

| | | | |
|---|---|---|---|
| 2730153 | 1/1979 | Fed. Rep. of Germany . | |
| 24412 | 2/1977 | Japan | 455/302 |
| 25233 | 2/1980 | Japan | 455/332 |
| 1431109 | 4/1976 | United Kingdom | 455/323 |
| 1507877 | 4/1978 | United Kingdom . | |
| 2018081 | 10/1979 | United Kingdom . | |

Primary Examiner—Jin F. Ng
Attorney, Agent, or Firm—Robert T. Mayer; Bernard Franzblau

[57] ABSTRACT

An image rejection mixer circuit comprises a pair of mixers (1, 2) to which are supplied input signals from an input terminal (9) and oscillation signals in mutual quadrature from an oscillator (11). The mixer output signals are combined in a combining means (19) to produce at its output (20, 21) a frequency-translated wanted signal free from frequency-translated image signals. The combining means comprises an acoustic surface wave filter and, in order to avoid the necessity of providing it with a pair of input transducers, with the consequent increase in the area of piezo-electric substrate that would entail, it is provided with a single input transducer of the four-phase or pseudo four-phase type. The mixer output signals are applied to respective ones of the quadrature inputs (17 and 18) of the input transducer which, because of the phase relationships between the various components of the mixer output signals, produces acoustic surface waves which travel toward an output transducer if they correspond to a frequency translated wanted input signal and travel away from the output transducer if they correspond to a frequency-translated image signal.

1 Claim, 4 Drawing Figures

IMAGE REJECTION MIXER CIRCUIT ARRANGEMENT

This invention relates to an image rejection mixer circuit arrangement comprising first and second signal mixers each having first and second inputs and an output, a signal input coupled to the first input of each mixer, a local oscillator, a coupling from an output of said local oscillator to the second input of the first mixer, a coupling from an output of said local oscillator to the second input of the second mixer, means for producing a relative phase difference of substantially 90° between signals applied in operation to the respective said first inputs or to the respective said second inputs, and signal combining means having inputs coupled to the mixer outputs for combining the output signals of the mixers in such manner as to produce at an output thereof, when oscillator output signals of a given frequency are applied to said second inputs and first and second input signals having respective frequencies which are symmetrically spaced with respect to, and have a specific spacing from, said given frequency are applied to said signal input, the said first input signal translated to a lower frequency while suppressing at said output said second input signal also translated to said lower frequency.

One known arrangement of this kind is disclosed in German Offenlegungsschrift No. 2730153. In this known arrangement input signals applied to the signal input are fed, either in phase with each other or in antiphase, to the first inputs of the mixers and oscillation signals are applied from the oscillator in quadrature to the second inputs of the mixers. The signal combining means comprises a summing or differencing amplifier (depending on whether the signals applied to the first inputs of the mixers are in phase or in antiphase), a first surface acoustic wave device bandpass filter coupling the output of the first mixer to one input of the amplifier and a second surface acoustic wave device bandpass filter coupling the output of the second mixer to the other input of the amplifier. Said filters have the same pass frequency characteristic and share a common piezo-electric substrate. The spacing between the input and output electro-acoustic transducers of one saw filter device is different from the spacing between the input and output electro-acoustic transducers of the other, the difference being chosen so that a relative phase shift of 90° is produced between signals traversing respective ones of the two devices when these signals have a frequency equal to the centre-frequency of the pass characteristic of the two devices. The result is that, when input signals having respective frequencies which are symmetrically spaced with respect to the frequency of the oscillation signals and differ therefrom by an amount equal to the centre-frequency of the bandpass filters are applied to the signal input, only one such input signal translated to a lower frequency (the difference between the frequency of the input signal and the frequency of the oscillation signal) appears at the amplifier output, in spite of both being present in the output signals of the mixers. This is because the components of the output signal of one mixer arising from the translation to a lower frequency of the two input signals will be in phase with each other, whereas the components of the output signal of the other mixer arising from the translation to a lower frequency of the two input signals will be in antiphase with each other and in mutually opposite quadrature to the corresponding components of the output signal of the first-mentioned mixer. Thus, introducing a 90° phase shift in one of these output signals and adding the result to or subtracting the result from the other output signal will result, in the ideal case, in a signal which contains the components arising from one input signal but not those arising from the other.

The known arrangement has the disadvantage that a rather large area of piezo-electric substrate is required for the two surface acoustic wave devices. Moreover, the two devices tend to suffer from a rather large insertion loss due to the fact that half the acoustic surface wave energy produced by each input transducer travels away from, rather than towards, the corresponding output transducer. It is an object of the invention to mitigate these disadvantages.

The invention provides an image rejection mixer circuit arrangement comprising first and second signal mixers, each having first and second inputs and an output, a signal input coupled to the first input of each mixer, a local oscillator, a coupling from an output of said local oscillator to the second input of the first mixer, a coupling from an output of said local oscillator to the second input of the second mixer, means for producing a relative phase difference of substantially 90° between signals applied in operation to the respective said first inputs or to the respective said second inputs, and signal combining means having inputs coupled to the mixer outputs for combining the output signals of the mixers in such manner as to produce at an output thereof, when oscillation signals of a given frequency are applied to said second inputs and first and second input signals having respective frequencies which are symmetrically spaced with respect to, and have a specific spacing from, said given frequency are applied to said signal input, the said first input signal translated to a lower frequency while suppressing at said output said second input signal also translated to said lower frequency, characterized in that said signal combining means comprises an acoustic surface wave device comprising a piezoelectric substrate for propagating acoustic surface waves at a surface thereof, a first electro-acoustic transducer structure formed on said surface for launching acoustic surface waves along a propagation path at said surface and a second electro-acoustic surface wave transducer structure formed on said surface for receiving acoustic surface waves propagating along said path, said first transducer structure being of a four-phase or pseudo-four-phase unidirectional type having first and second inputs for mutually quadrature-related signals, the outputs of said first and second mixers being coupled to said first and second inputs, respectively, of said first transducer structure.

Such unidirectional electro-acoustic transducer structures (see, for example, the paper by R. C. Peach and C. Dix entitled "A low loss medium bandwidth filter on lithium niobate" in Proc. IEEE Ultrasonic Symposium, 1978, pages 509–512, published British patent specification Ser. No. 2018081, and the paper by D. C. Malocha and S. Wilkus entitled "Low loss capacitively weighted TN IF filter" in Proc. IEEE Ultrasonics Symposium, 1978, pages 500–503, particularly FIG. 5 on page 502 thereof) require, if they are to operate in a unidirectional manner, i.e. in such a manner that acoustic surface waves are propagated thereby in substantially only one direction, that identical signals lying within a specific narrow frequency band are applied in mutual quadrature one to each of their first and second inputs. This quadrature relationship is normally obtained by feeding both inputs from a common signal source and including a suitable phase shifter in one or both feed paths. It has now been recognized that in a mixer circuit arrangement of the kind defined in the first paragraph the output signals of the first and second mixers are suitable for application directly to these first and second inputs, i.e., without the interposition of a phase-shifting arrangement, because of the inherent phase relationships between the aforesaid components of the mixer output signals. Provided that their frequencies lie within the aforesaid specific narrow frequency band the components of the mixer output signals arising from the translation to a lower frequency of one of said first and second input signals applied to said signal input will give rise to corresponding acoustic surface waves propagating in a given direction (only) and the components of the mixer output signals arising from the translation to a lower frequency of the other of said first and second input signals will give rise to corresponding acoustic surface waves propagating in the opposite direction (only). Thus, if the second transducer is positioned to receive the acoustic surface waves propagated by the first transducer in the given direction, to the exclusion of those propagated in the opposite direction, its output signal will correspond to only one of the frequency-translated first and second input signals as required. The propagation of the waves corresponding to the two frequency-translted input signals in opposite directions arises because of the fact that, although both input signals give rise to components of the mixer signals which are in quadrature with each other, the quadrature relationship of the components arising from the translation to a lower frequency of one input signal is opposite to the quadrature relationship of the components arising from the translation to a lower frequency of the other input signal. Thus the arrangement can achieve a similar result to that obtained by means of the arrangement disclosed in German Offenlegungsschrift No. 2730153 without the acoustic surface wave device required two input transducers together with the area of piezo-electric substrate which would then be required to accommodate the second transducer and a propagation path therefrom to an output transducer, and without a substantial proportion of the wanted mixer output signal components giving rise to acoustic surface waves which are unused.

Embodiments of the invention will now be described, by way of example, with reference to the accompanying diagrammatic drawings in which.

Figure 1:
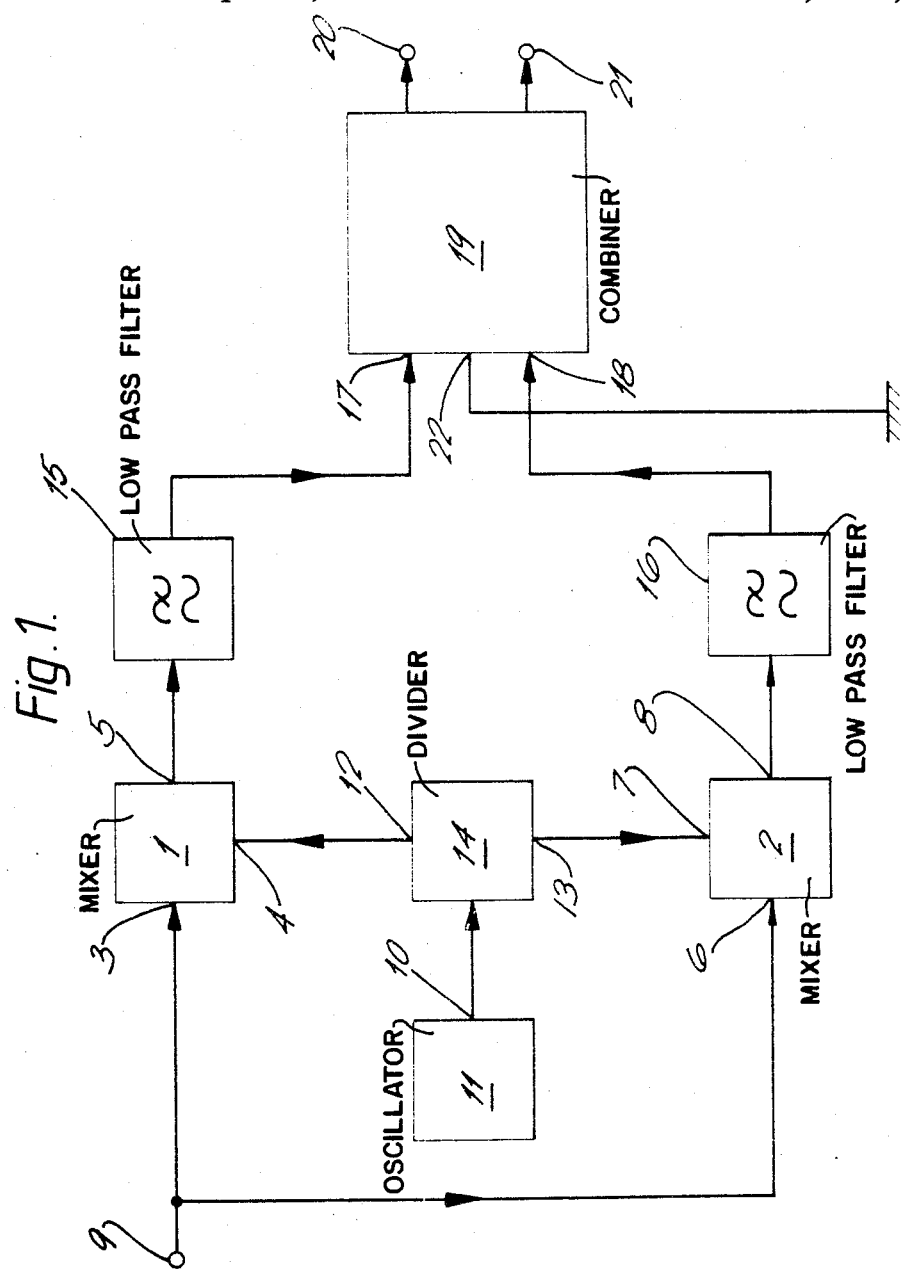
FIG. 1 is a block diagram of an embodiment.

In FIG. 1 an image rejection mixer circuit arrangement comprises first and second mixers 1 and 2 respectively. Mixer 1 has a first input 3, a second input 4 and an output 5. Similarly mixer 2 has a first input 6, a second input 7 and an output 8. A signal input 9 is coupled to the first inputs 3 and 6. An output 10 of an oscillator 11 is coupled to the second inputs 4 and 7 via outputs 12 and 13 respectively of a frequency divider-by-two arrangement collectively denoted by reference numeral 14. Divider-by-two arrangement 14 is constructed so that oscillation signals of half the output frequency of oscillator 11 appear in mutual quadrature at its outputs 12 and 13 respectively, and hence at the mixer inputs 4 and 7 respectively. The outputs 5 and 8 of the mixers 1 and 2 respectively are coupled via low-pass filters 15 and 16 respectively to first and second inputs 17 and 18 respectively of signal combining means 19. Combining means 19 combines the output signals of the mixers 1 and 2, filtered by filters 15 and 16 to remove the components of these output signals having frequencies equal to merely the frequencies of input signals applied to signal input 9 and the oscillation signals applied to second inputs 4 and 7 and also frequencies equal to the sum of these frequencies, so as to leave only components having frequencies equal to the difference between these frequencies, in such manner as to produce across output terminals 20 and 21 thereof, when oscillation signals of a given frequency are applied to the mixer second inputs 4 and 7 from divider arrangment 14 and first and second input signals having respective frequencies which are symmetrically spaced with respect to, and have a specific spacing from, said given frequency, the said first signal translated to a lower frequency (the difference between the frequency of the first signal and that of the oscillation signals) while suppressing at the output terminals 20 and 21 the said second signal (which signal is at the so-called image frequency) translated to the said lower frequency. To this end combining means 19, possible specific constructions for which will be described with reference to FIGS. 3 and 4, comprises an acoustic surface wave device comprising a piezo-electric substrate for propagating acoustic surface wave at a surface thereof, a first electro-acoustic transducer structure formed on said surface for launching acoustic surface waves along a propagation path at said surface, and a second electro-acoustic surface wave transducer structure formed on said surface for receiving acoustic surface waves propagating along said path. The first transducer structure is of a pseudo-four-phase unidirectional type and has first and second inputs for mutually quadrature-related signals, these inputs being connected to the inputs 17 and 18 respectively. A common terminal of the first transducer structure is connected to point 22, which is connected to ground. The second transducer structure is connected to the output terminals 20 and 21 which may be connected in turn to, for example, the input of an intermediate frequency amplifier in a broadcast receiver, the signal input 9 then being fed from an aerial (not shown).

Figure 2:
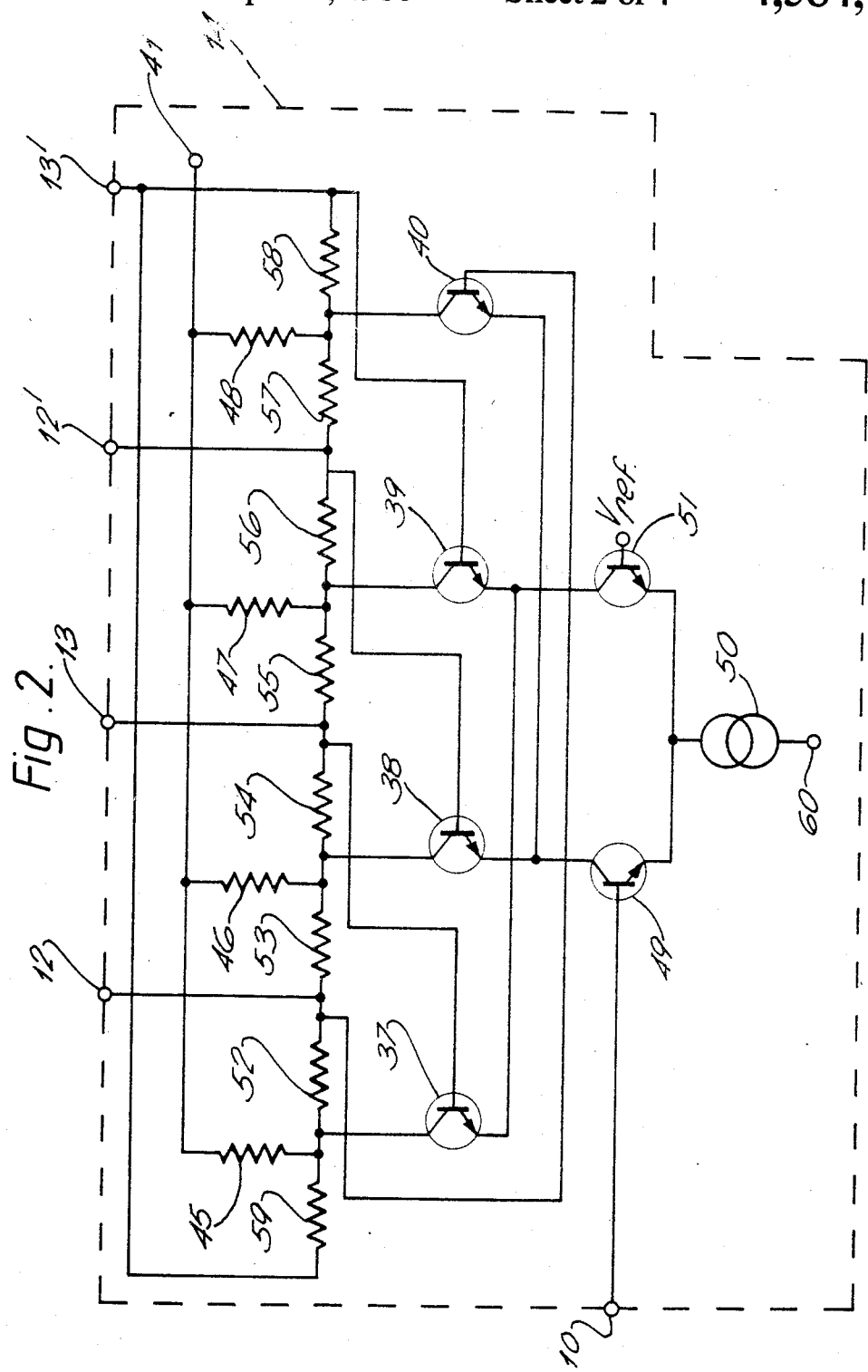
FIG. 2 shows a possible construction for a part of the embodiment of FIG. 1.

FIG. 2 shows a possible construction for the frequency divider-by-two arrangement 14 of FIG. 1. In FIG. 2 the output 10 of the oscillator 11 of FIG. 1 is coupled to the base of a transistor 49 the emitter of which is connected to the output of a current source 50 and to the emitter of a transistor 51 the base of which is held at a reference potential $V_{ref}$. The collector of transistor 51 is connected to the commoned emitters of a pair of transistors 37 and 39 and the collector of transistor 49 is connected to the commoned emitters of a pair of transistors 38 and 40. The collectors of transistors 37, 38, 39 and 40 are connected to a positive power supply terminal 41 via equal-value load resistors 45, 46, 47 and 48 respectively. The collector of transistor 37 is connected to the collector of transistor 38 via the series combination of resistors 52 and 53, the collector of transistor 38 is connected to the collector of transistor 39 via the series combination of resistors 54 and 55, the collector of transistor 39 is connected to the collector of transistor 40 via the series combination of resistors 56 and 57, and the collector of transistor 40 is connected to the collector of transistor 37 via resistors 58 and 59. Resistors 52-59 have equal values. Output terminals 12, 13, 12' and 13' are connected to the common point of resistors 52 and 53, the common point of resistors 54 and 55, the common point of resistors 56 and 57, and the common point of resistors 58 and 59 respectively. A negative power supply terminal 60 is connected to the current source 50.

In operation transistors 49 and 51 are turned on alternately in response to successive half-cycles of the input signal applied to terminal 10 and this results in a voltage wave travelling around the loop formed by the resistors 52-59 once every two cycles of the input signal. Thus a first output signal at half the frequency of the input signal appears in a balanced manner at terminals 12 and 12' and a second output signal also at half the frequency of the input signal and in quadrature with the first output signal appears in a balanced manner at terminals 13 and 13'. The circuit of FIG. 2 is substantially as described and claimed in British Pat. No. 1,507,877 (PHN 7833) and as shown in FIG. 9 on page 60 of the article "Frequency-dividers for ultra-high frequencies" by W. O. Kasperkovitz published in Philips Tech, Rev. 38, 1978/79 no. 2, pages 54–68.

Figure 3:
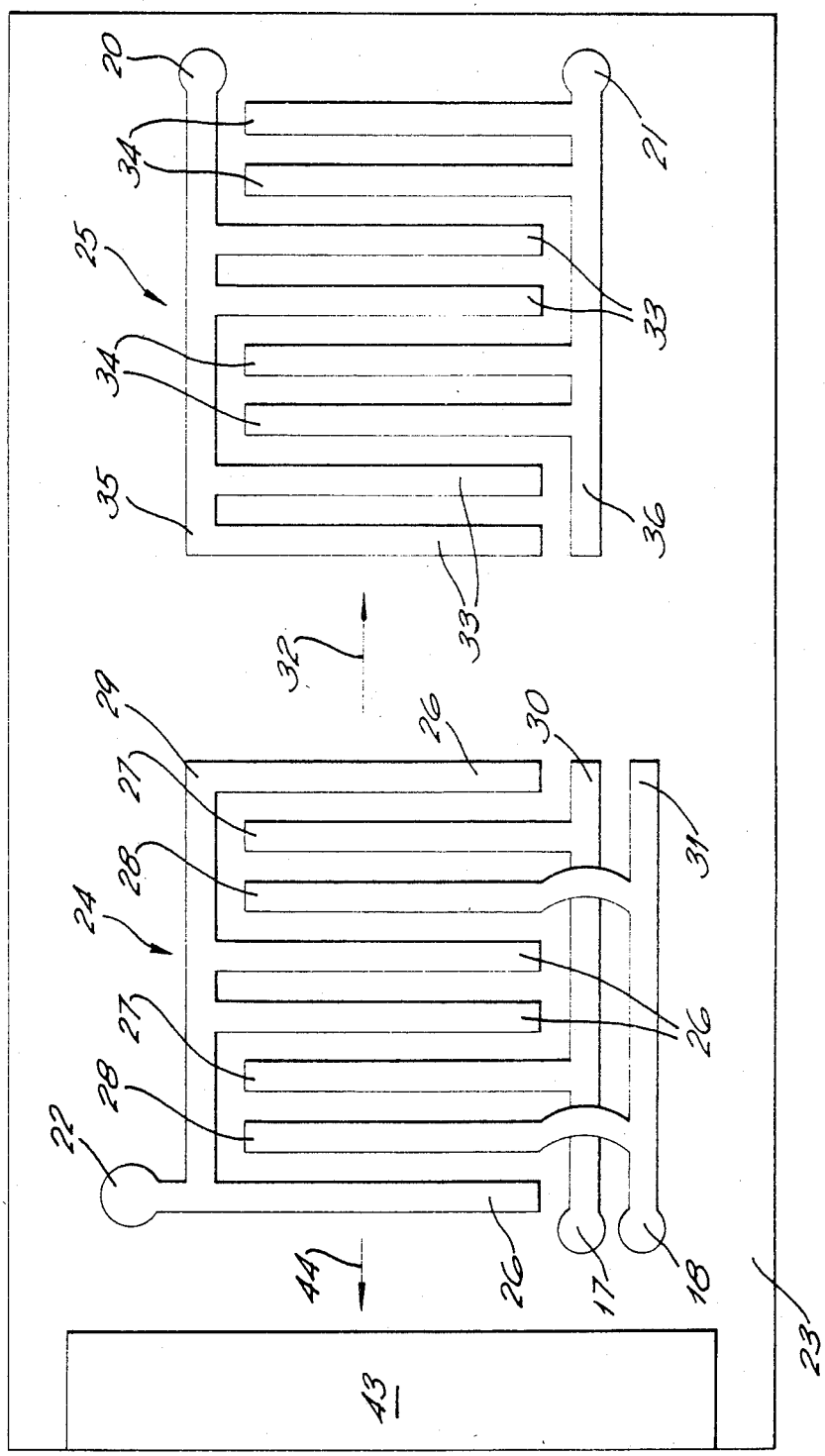
FIG. 3 shows a first possible configuration for an acoustic surface wave device which forms part of the embodiment of FIG. 1.

FIG. 3 shows, diagrammatically, a plan view of a first possible configuration for the combining means 19 of FIG. 1. As shown in FIG. 3 it is in the form of an acoustic surface wave device comprising a piezo-electric substrate 23, for example of lithium niobate cut and orientated in known manner. For example it may be Y-cut Z-propagating, or 41° or 124° to 131° rotated Y-cut X-propagating. On the surface of substrate 23 are provided, for example in conventional manner by a process of photolithography, a first or input transducer 24 of a pseudo-four-phase unidirectional type and a second or output transducer 25. Transducer 24 comprises an interdigital array of first, second and third sets of electrodes 26, 27 and 28 respectively with the electrodes of these sets connected to bus-bars 29, 30 and 31 respectively. Bus-bars 29, 30 and 31 are provided with contact pads which constitute the terminals 22, 17 and 18 respectively of FIG. 1. In operation transducer 24 launches an acoustic surface wave along a propagation path towards transducer 25, this path being indicated by an arrow 32. Transducer 25 comprises an interdigital array of first and second sets of electrodes 33 and 34 respectively with the electrodes of these sets connected to bus-bars 35 and 36 respectively. Bus-bars 35 and 36 are connected to contact pads which constitute the terminals 20 and 21 respectively of FIG. 1. The centre-to-centre distances or pitch of the electrodes in each array is equal to $\lambda/4$, where $\lambda$ is the wavelength of acoustic surface waves which would be launched along the path 32 should suitably quadrature-related electric input signals having a frequency $f_i$ be applied to pads 17 and 18 respectively, relative to pad 22, where $f_i$ is the difference frequency between signals applied to terminal 9 and the oscillation signals applied to mixer inputs 4 and 7 to which the arrangement of FIG. 1 is required to respond, i.e. to the centre-frequency of the desired IF signal at the output terminals 20 and 21. The widths of the electrodes in each array may be equal to $\lambda/8$. Transducer 24 is as described and claimed in British patent specification No. 2018081.

Transducer 24 launches waves along path 32 and not in the opposite direction, i.e. along a path denoted by arrow 44, only if the signal of frequency $f_i$ applied to pad 18 leads the signal applied to pad 17 by 90°. If the signal of frequency $f_i$ applied to pad 18 lags the signal applied to pad 17 by 90° transducer 24 launches waves along path 44 and not along path 32. Any waves launched along path 44 are absorbed by an area 43 of acoustic surface wave absorbent material, for example silicone rubber, provided where shown on the top surface of the substrate 23. Thus, when oscillation signals of a given frequency $f_o$ are applied to the second inputs 4 and 7 of the mixers 1 and 2 of the arrangement of FIG. 1, and input signals having frequencies equal to $(f_o+f_i)$ and $(f_o-f_i)$ respectively are applied to signal input 9, the transducer 25 will receive surface acoustic waves corresponding to only one of these input signals translated to the difference frequency $f_i$, because of the phase relationships between the various resulting components of the output signals of mixers 1 and 2 as set forth hereinbefore.

In practice the transducers 24 and 25 will contain more than the eight electrodes shown in each. They may each be extended in an exactly similar manner to that shown to contain for example, eighty electrodes. The transducer 25 may be apodized in known manner, if desired, so as to obtain a particular required IF frequency response characteristic. Moreover transducer 25 may be of the single-finger type (with successive electrodes connected to the bus-bars 35 and 36 alternately and having centre-to-centre distances of $\lambda/2$) instead of the double-finger type shown. It should be noted that substantially complete separtion of the difference signal corresponding to a wanted input signal from the difference signal corresponding to an input signal at the image frequency is only obtained by means of transducer 24 when the difference signals have a frequency exactly equal to $f_i$; increasing deviations from this frequency give rise to increasing proportions of acoustic surface waves which should be launched in only one of the paths 32 and 44 in fact being launched in the other. Thus the arrangement described gives satisfactory image rejection only when the IF fractional bandwidth is sufficiently small. The actual IF fractional bandwidth with which the arrangement can operate satisfactorily will depend on the degree of image rejection required in the particular context in which it is employed. If desired the IF fractional bandwidth with which the arrangement can cope satisfactorily may be increased by applying an appropriate phase correction to the mixer output signals.

Figure 4:
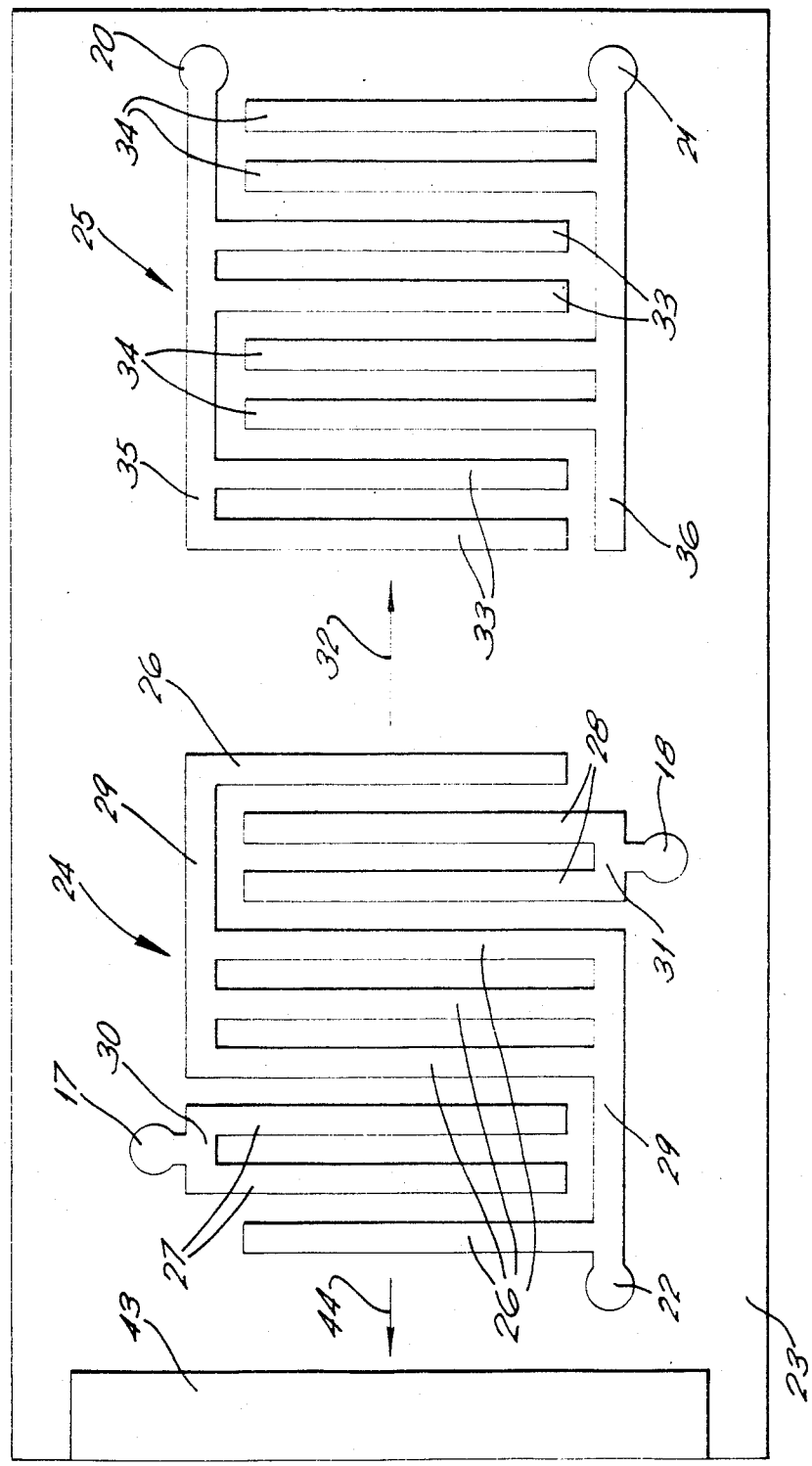
FIG. 4 shows a second possible configuration for the said acoustic surface wave device.

FIG. 4 shows, diagrammatically, a plan view of a second possible configuration for the combining means 19 of FIG. 1. The configuration of FIG. 4 is very similar to that of FIG. 3, and corresponding components in each have been given the same reference numerals. The difference between the configuration of FIG. 4 and that of FIG. 3 is that the unidirectional transducer 24 is now of the "group" type, as shown in FIG. 5 of the paper by Malocha and Wilkus previously referred to, thus avoiding the crossover in the connections of the electrodes to the bus-bars 17 and 18 in FIG. 3. The centre-to-centre distances of the electrodes in each transducer is again $\lambda/4$, and again the transducers will in practice contain more electrodes than the number actually shown.

Although in both FIG. 3 and FIG. 4 the unidirectional transducer 24 is of the pseudo four-phase type it will be appreciated that, as an alternative, it may be actually four-phase, with successive electrodes having centre-to-centre distances of 80 /4 being supplied fro the mixers 1 and 2 alternately, the signals applied to alternate electrodes always being inverted with respect to each other. However, such a four-phase transducer requires even more crossovers than those shown in the transducer 24 of FIG. 3 and is in consequence rather difficult to manufacture. Pseudo four-phase transducers (of which there are other configurations than those shown) are therefore preferred.

Although in FIG. 1 the oscillation signals applied to the second inputs 4 and 7 of the mixers are in mutual quadrature, and the signals applied to the first inputs 3 and 6 are in phase (or in antiphase if an inverter, not shown, is included in the signal path to one first input) it will be appreciated that, as an alternative, it may be arranged that the oscillation signals applied to the second inputs are in phase with each other and the signals applied to the first inputs are in mutual quadrature. To this end the divider circuit 14 of FIG. 1 may be replaced by a direct connection and, for example, a 90° phase shifter may be included in the signal path from signal input 9 to one of the first inputs 3 and 6, or phase shifters giving phase shifts of +45° and −45° respectively may be included in respective one of the signal paths from signal input 9 to the first inputs 3 and 6. Normally, however, it will be more convenient to apply oscillation signals to the second inputs 4 and 7 that are in mutual quadrature.

There are, of course, alternative ways of producing the mutually quadrature-related oscillation signals for the mixer inputs 4 and 7. For example, oscillator 11 may be arranged to operate at the frequency which it is required be applied to the inputs 4 and 7 and divider-by-two arrangement 14 may be replaced by a 90° hybrid.

We claim:

1. An image rejection mixer circuit arrangement comprising first and second signal mixers each having first and second inputs and an output, a signal input coupled to the first input of each mixer, a local oscillator producing oscillation signals of a given frequency, means for coupling an output of said local oscillator to the second input of the first mixer, and to the second input of the second mixer, the signal input receiving first and second input signals having respective frequencies which are symmetrically spaced with respect to, and have a specific spacing from, said given frequency, means for producing a relative phase difference of substantially 90° between signals applied in operation to the respective said first inputs or to the respective said second inputs, and signal combining means having inputs coupled to the mixer outputs, said signal combining means combining the output signals of the mixers in such manner as to produce at an output thereof, the said first input signal translated to a lower frequency while suppressing at said output said second input signal which is also translated to said lower frequency, characterized in that said signal combining means comprises an acoustic surface wave device comprising a piezo-electric substrate for propagating acoustic surface waves at a surface thereof, a first electro-acoustic transducer structure on said surface for launching acoustic surface waves along a propagation path at said surface, and a second electro-acoustic surface wave transducer structure on said surface for receiving acoustic surface waves propagating along said path, said first transducer structure being of a four-phase or pseudo-four-phase unidirectional type having first and second inputs for mutually quadrature-related signals, the outputs of said first and second mixers being coupled to said first and second inputs of said first transducer structure respecitvely.

* * * * *